(12) United States Patent
Cowley et al.

(10) Patent No.: US 7,356,321 B2
(45) Date of Patent: Apr. 8, 2008

(54) RADIO FREQUENCY TUNER

(75) Inventors: Nicholas Paul Cowley, Wroughton (GB); Lance Trodd, Swindon (GB)

(73) Assignee: Intel Corporation, Santa Clara, CA (US)

( * ) Notice: Subject to any disclaimer, the term of this patent is extended or adjusted under 35 U.S.C. 154(b) by 1492 days.

(21) Appl. No.: 10/004,766

(22) Filed: Dec. 4, 2001

(65) Prior Publication Data
US 2002/0086654 A1 Jul. 4, 2002

(30) Foreign Application Priority Data
Dec. 5, 2000 (GB) ................................. 0029564.2
May 1, 2001 (GB) ................................. 0110607.9

(51) Int. Cl.
*H04B 7/00* (2006.01)
*H04B 1/06* (2006.01)

(52) U.S. Cl. ............................... 455/240.1; 455/234.1; 455/245.1

(58) Field of Classification Search ................ 455/130, 455/257, 240.1, 245.1, 249.1, 247.1, 310–311, 455/250.18, 239.1, 557, 234.1, 136; 348/678, 348/707, 731; 330/254, 278; 375/222
See application file for complete search history.

(56) References Cited

U.S. PATENT DOCUMENTS

| | | | | |
|---|---|---|---|---|
| 6,037,999 A | * | 3/2000 | Kunishima | 348/731 |
| 6,160,572 A | * | 12/2000 | Matsuura | 725/126 |
| 6,298,222 B1 | * | 10/2001 | Bergveld et al. | 455/127.5 |
| 6,407,632 B1 | * | 6/2002 | Madni et al. | 330/85 |
| 6,728,524 B2 | * | 4/2004 | Yamanaka et al. | 455/232.1 |
| 6,791,414 B2 | * | 9/2004 | Trodd et al. | 330/254 |
| 7,079,195 B1 | * | 7/2006 | Birleson et al. | 348/725 |
| 7,091,792 B2 | * | 8/2006 | Mehr | 330/305 |
| 2004/0229561 A1 | * | 11/2004 | Cowley et al. | 455/3.01 |
| 2004/0235443 A1 | * | 11/2004 | Gomez | 455/200.1 |
| 2007/0042732 A1 | * | 2/2007 | Kang et al. | 455/179.1 |

FOREIGN PATENT DOCUMENTS

| | | |
|---|---|---|
| EP | 0777334 | 6/1997 |
| EP | 0795967 | 9/1997 |
| GB | 2250402 | 6/1992 |
| GB | 2290927 | 1/1996 |
| GB | 2314706 | 1/1998 |
| GB | 2317080 | 3/1998 |

* cited by examiner

*Primary Examiner*—Sonny Trinh
(74) *Attorney, Agent, or Firm*—Blakely, Sokoloff, Taylor & Zafman LLP (57) ABSTRACT

A radio frequency tuner is provided for selecting channels from a cable distribution network or other reception system. The tuner has one or more stages whose performance, such as signal to noise plus intermodulation, and gain are functions of the stage power consumption. A comparator compares the tuner performance, such as bit error rate, with a predetermined performance. When the tuner performance exceeds the predetermined performance, a power consumption control circuit reduces the power consumption of one or more of the stages so as to reduce the tuner power consumption while maintaining acceptable tuner performance. As an alternative, the control circuit may have an input which allows the power consumption to be preset in accordance with the tuner application. The control circuit also controls a variable gain arrangement to compensate for changes in gain resulting from changes in power consumption.

14 Claims, 12 Drawing Sheets

RADIO FREQUENCY TUNER

BACKGROUND OF THE INVENTION

1. Field of the Invention

The present invention relates to a radio frequency tuner. Such a tuner may be used as a cable tuner for receiving modulated digital signals from a cable distribution network, for example, as a set top box for receiving television signals. Other applications include use for cable telephony and as a modem for data signals.

2. Description of the Prior Art

Known types of cable tuners may be of the single conversion or double conversion type. By way of illustration, FIG. 1 of the accompanying drawings illustrates a double conversion cable tuner for digital signals. The tuner has an input 1 for connection to a cable distribution network and connected to an automatic gain control (AGC) stage 2. The output of the stage 2 is connected to a first frequency changer 3 for performing up-conversion and comprising a mixer 4 and a local oscillator 5 controlled by a phase locked loop (PLL) synthesiser 6.

Figure 1:
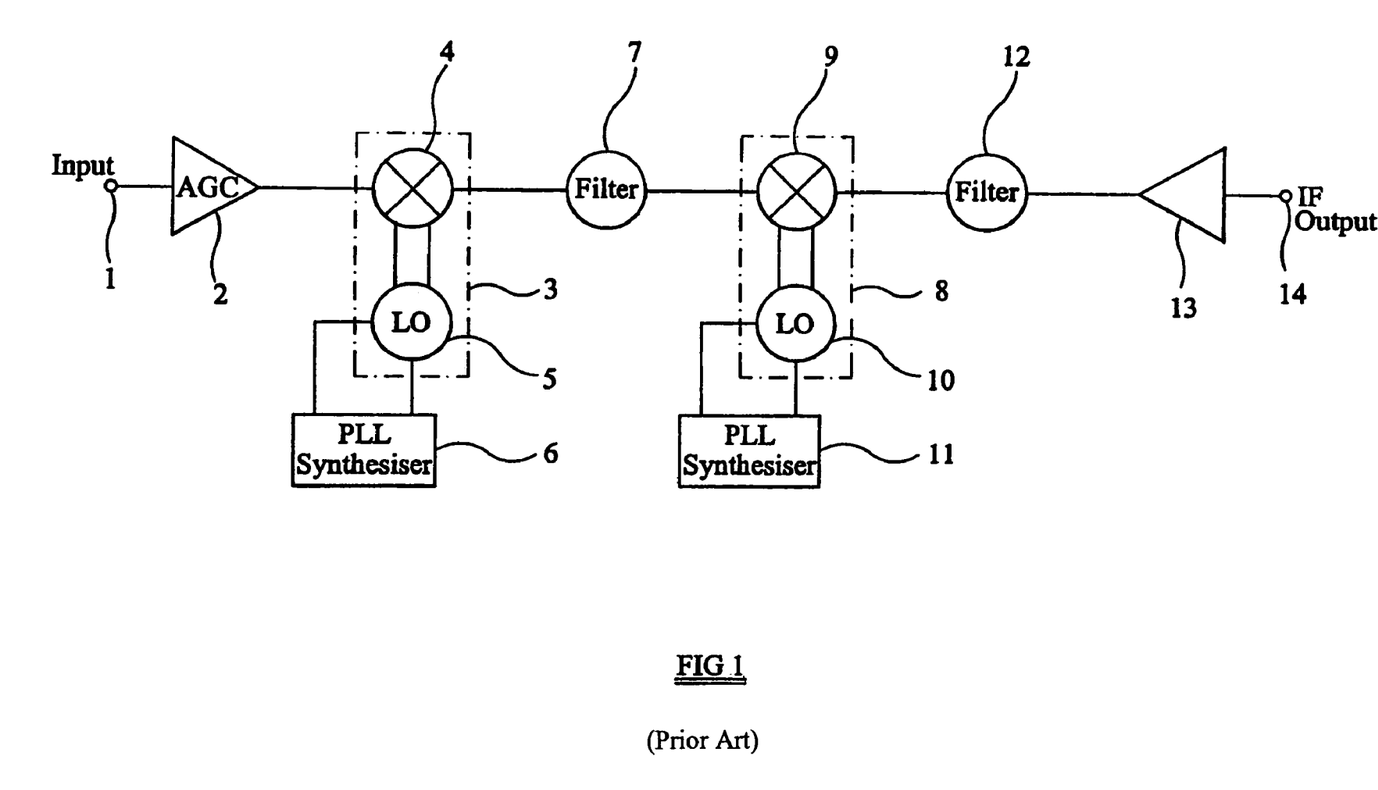
FIG. 1 is a block circuit diagram of a known type of double conversion cable tuner.

The output of the first frequency changer 3 is connected via a first intermediate frequency filter 7 to a second frequency changer 8 of the down-conversion type. The second frequency changer 8 comprises a mixer 9 and a local oscillator 10 controlled by a PLL synthesiser 11. The output of the second frequency changer 8 is supplied by a second intermediate frequency filter 12 to an intermediate frequency (IF) amplifier 13 whose output supplies an IF signal to the output 14 of the tuner.

Figure 2:
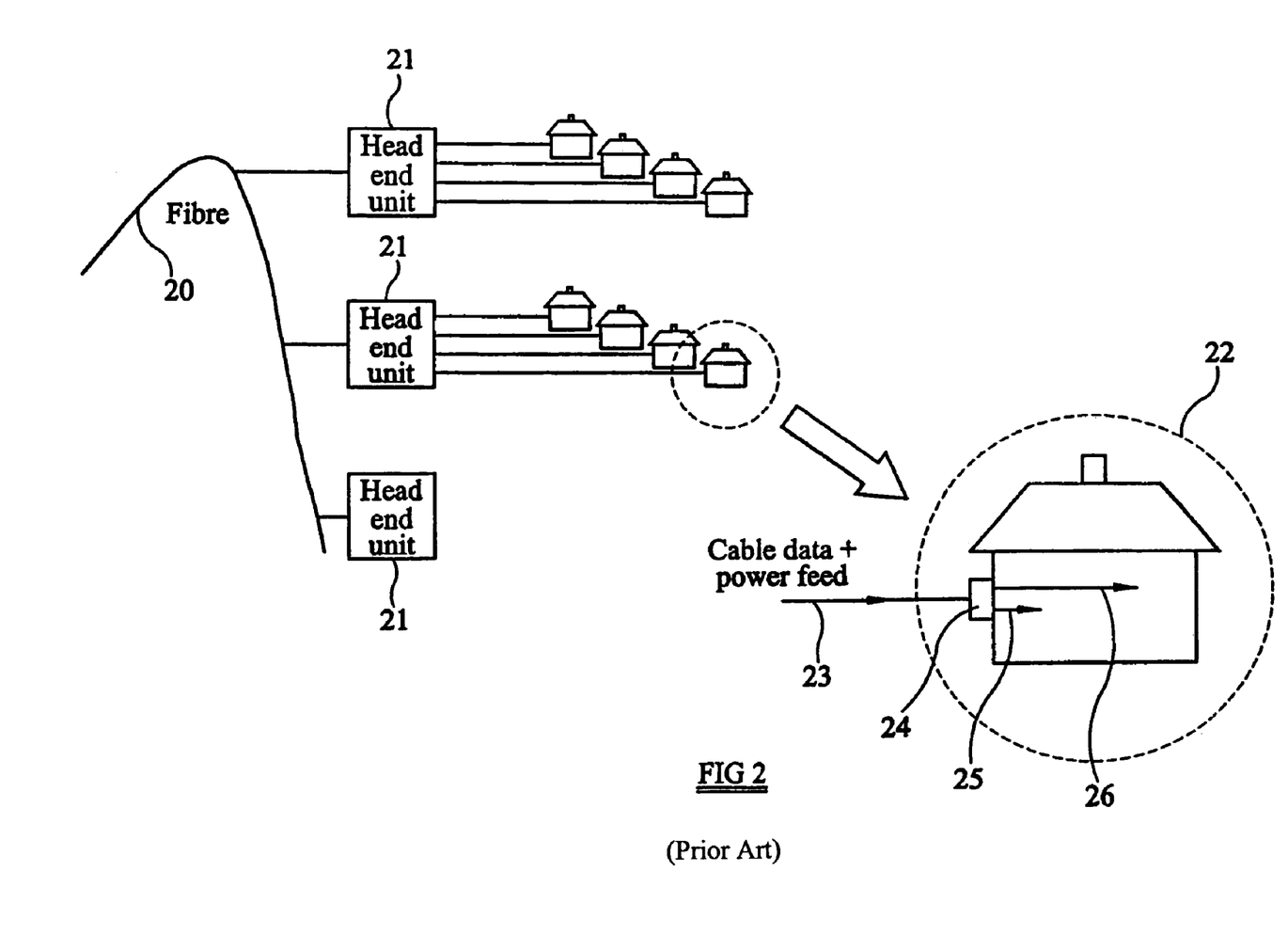
FIG. 2 is a block schematic diagram of a known type of cable distribution system.

FIG. 2 of the accompanying drawings illustrates a typical cable distribution system. The system comprises an optical fibre "backbone" 20 which supplies a plurality of head end distribution units 21. Each of the units 21 services a plurality of properties, such as houses and offices, as illustrated at 22. A cable 23 connects each property to its head end unit 21, which supplies the signals from the distribution network and which also supplies power to a modem 24 including a tuner of the type shown in FIG. 1. The modem 24 is continuously powered and supplies a telephony service by means of a conventional twisted pair 25 and a cable service for further modem applications such as television and internet as illustrated at 26.

The tuner is required to convert any selected channel from the cable distribution network to an intermediate frequency in the form of a signal having characteristics which are sufficient to ensure acceptable perceived performance. For example, the signal to noise plus intermodulation performance must be sufficient for acceptable television or data signals to be provided. The signals from the cable distribution network are supplied to the AGC stage 2 which controls the signal level supplied to the first frequency changer 3 so as to provide an acceptable intermodulation performance of the first frequency changer. In general, little or no filtering takes place before the frequency changer 3, which is therefore required to have a high level of performance.

The frequency changer 3 performs block up-conversion of the broad band input signal with the frequency of the local oscillator 5 being selected by the synthesiser 6 such that a desired channel is centered on a high first intermediate frequency. The synthesiser 6 and the synthesiser 11 are, for example, controlled via an 12C bus micro-controller (not shown).

The output of the first frequency changer 3 is filtered by the filter 7, which has a centre frequency at the predetermined first intermediate frequency and a pass-band characteristic such that the desired channel and a small number of further channels on either side of the desired channel are supplied to the second frequency changer 8.

The second frequency changer 8 performs a block down-conversion such that the desired channel is centered on the second much lower intermediate frequency. The output signal of the second frequency changer 8 is filtered by the filter 12 whose centre frequency is centered on the centre frequency of the desired channel following the second conversion and which has a pass-band for passing the desired channel and for rejecting or substantially attenuating the adjacent channels. The desired channel at the second intermediate frequency is amplified by the amplifier 13 and supplied to the tuner output 14.

Known types of tuner (of the type shown in FIG. 1 and of other types such as the single conversion type) are required to be able to cope with all extremes of signal conditions. In particular, such tuners are required to handle a wide dynamic range of signals and to cope with worst case composite signal loading, maximum channel to channel ripple and various other conditions, both singly and in any combination.

As a result of these requirements, for much of the time during operation, each tuner in a cable distribution system provides a much higher performance than is actually required by the individual channels being received. For example, in the case of modulated digital signals, there is no advantage in providing a tuner performance which exceeds a threshold value for signal to noise plus intermodulation performance. In such cases, the presence of complex Forward Error Correction techniques, such as Read Solomon Coding and Viterbi puncturing, means that there is no or no perceivable improvement in reception when a minimum threshold of signal to noise plus intermodulation is achieved.

The power consumption of a tuner is generally a direct function of the performance of the tuner. The term "direct function" in this context means that, for over at least a range of power consumptions, the performance of the tuner is a monotonic function of the power consumption of the tuner. In other words, the tuner performance increases monotonically as the tuner power consumption increases. Thus, more power is consumed, for example from the cable distribution network powering the modems 24, than is necessary to achieve the desired performance. Unnecessary power consumption is undesirable for many reasons, such as cost and environmental factors. With the increasing use of cable distribution systems and consequently of modems incorporating such tuners, the problem of increased power consumption is in turn increasing and is undesirable.

Known types of tuners, such as that illustrated in FIG. 1, are individually designed for different applications. For example, the reception of analogue signals requires very low intermodulation and cross-modulation generation but the phase noise requirement is not particularly demanding. On the other hand, reception of digital signals does not require such low intermodulation and cross-modulation generation but a better phase noise performance is required. Thus, individual tuners are specifically designed for different applications and this particularly affects the frequency changers. In particular, such tuners are designed in accordance with the modulation standard which they are required to receive. It has therefore not been possible to provide a "universal" tuner design which can be used for many different applications because achievement of the specification required to meet all standards would result in a non-optimum design having high power consumption and being commercially unattractive or unacceptable.

GB 2314706, GB 2290927, GB 2250402, EP 0795967, EP 0777334 and GB 2 317 080 disclose techniques for reducing power consumption in mobile radio equipment such as mobile cellular telephones. For example, GB 2 290 927 relating to mobile telephone applications uses the error rate from a demodulator to control the power supply of a radio receiver so that an adequate error rate performance is maintained. In the case of GB 2 250 402, the supply current to a receiver front end, comprising a radio frequency amplifier, a first frequency converter and a first intermediate frequency amplifier, is controlled so as to achieve a desired signal strength at the output of a second intermediate frequency stage. A similar technique is used in EP 0 795 967, in which the current consumption and hence the gain of a radio frequency amplifier are controlled.

SUMMARY OF THE INVENTION

According to the invention, there is provided a radio frequency tuner comprising: at least one stage of variable power consumption having a performance and a gain which are first and second functions, respectively, of the power consumption; a variable gain arrangement; and a control circuit for controlling the power consumption of the at least one stage and for controlling the variable gain arrangement to compensate at least partly for variation of the gain of the at least one stage.

The performance may comprise a signal corrupting performance, such as distortion performance.

The variable gain arrangement may comprise a controllable current steering circuit.

The variable gain arrangement may comprise a variable load impedance of the at least one stage.

The at least one stage may comprise a transconductance stage and the gain may be the transconductance thereof.

The at least one stage may comprise a controllable current source for controlling the power consumption.

The at least one stage may comprise a controllable degeneration impedance.

The performance of the at least one stage may be a direct function of the power consumption.

The control circuit may be responsive to means for setting the power consumption to achieve a desired tuner performance. The setting means may comprise a comparator for comparing the tuner performance with a first predetermined performance and for causing the control circuit to reduce the power consumption of the at least one stage when the tuner performance exceeds the first predetermined performance. The comparator may be arranged to compare the tuner performance with a second predetermined performance lower than the first predetermined performance and the control circuit may be arranged to increase the power consumption of the at least one stage when the tuner performance is less than the second predetermined performance.

The tuner performance may be the ratio of signal to noise plus intermodulation products.

The tuner may comprise a digital tuner. The tuner may comprise a demodulator and the tuner performance may be the bit error rate.

The first predetermined performance may be greater than an acceptable minimum performance. The second predetermined performance may be less than or equal to the acceptable minimum performance.

The bit error rate may be the instantaneous bit error rate, a time-averaged bit error rate, or a combination thereof.

The comparator may be arranged to perform the comparison continuously. As an alternative, the comparator may be arranged to perform the comparison periodically. As another alternative, the comparator may be arranged to perform the comparison each time the tuner is powered up. As a further alternative, the comparator may be arranged to perform the comparison each time a change of tuned frequency is requested.

The setting means may comprise means for selecting a desired power consumption. The selecting means may be arranged to select the desired power consumption from a plurality of fixed power consumptions.

The setting means may comprise a control input of the control circuit.

The setting means may be arranged to fix the power consumption during manufacture of the tuner.

The at least one stage may comprise at least one frequency changer stage. The at least one frequency changer stage may comprise an image reject mixer. The at least one frequency changer stage may comprise at least one low noise amplifier whose gain is dependent on power consumption. The at least one frequency changer stage may comprise at least one local oscillator whose power consumption is controllable by the control circuit.

The at least one stage may comprise at least one intermediate frequency amplifier.

The tuner may comprise a cable tuner.

The tuner may be formed as a single monolithic integrated circuit.

It is thus possible to provide a tuner whose power consumption can be selected according to the performance which is required of the tuner while substantially maintaining the gain structure or distribution of the tuner. For any particular application of the tuner, the power consumption can be reduced, minimised or optimised without substantially affecting the overall tuner gain or the individual stage gains. This may be achieved automatically or manually.

For example, the power consumption may be controlled automatically so as to provide a tuner of reduced power consumption compared with known types of tuner. It is possible to ensure, particularly but not exclusively in the case of a digital tuner for receiving digitally modulated signals, that an acceptable performance is provided for the signal or channel currently being received while reducing or minimising the power consumption. Although such a tuner may be used for any application, it may be used with advantage in cable distribution systems of the type described hereinbefore. Where such tuners are powered by the cable distribution system, the power consumption of the system can be reduced or minimised without substantially altering the tuner gain to provide a substantially lower power consumption than the known type of system. This can be achieved without any or any perceptible degradation in the received signals.

In another example, the power consumption may be set in a way which does not depend on the reception performance actually achieved by the tuner. The power consumption may be set during or after manufacture and this allows a single design of tuner to be adapted easily for any of a plurality of different applications. For example, such a tuner may be set to have: a relatively high power consumption so as to provide good intermodulation performance for analogue reception; a range of reduced power consumptions for various digital applications having various intermodulation performance requirements; a low power consumption for use in cable powered equipment. The gain can be adjusted to compensate for changes resulting from selecting the power consumption in accordance with the desired performance.

Digital applications require the local oscillator of a frequency changer to have low phase noise, and hence relatively high power consumption, whereas analogue applications are less sensitive to phase noise. Local oscillator power consumption can thus be set according to the tuner application so as to allow tuner power consumption to be substantially optimised for each application.

It is thus possible to provide a "universal" tuner which is suitable for different applications. Design time and cost and manufacturing cost may therefore be reduced.

BRIEF DESCRIPTION OF THE DRAWINGS

The present invention will be further described, by way of example, with reference to the accompanying drawings, in which.

Like reference numerals refer to like parts throughout the drawings.

DESCRIPTION OF THE PREFERRED EMBODIMENTS

Figure 3:
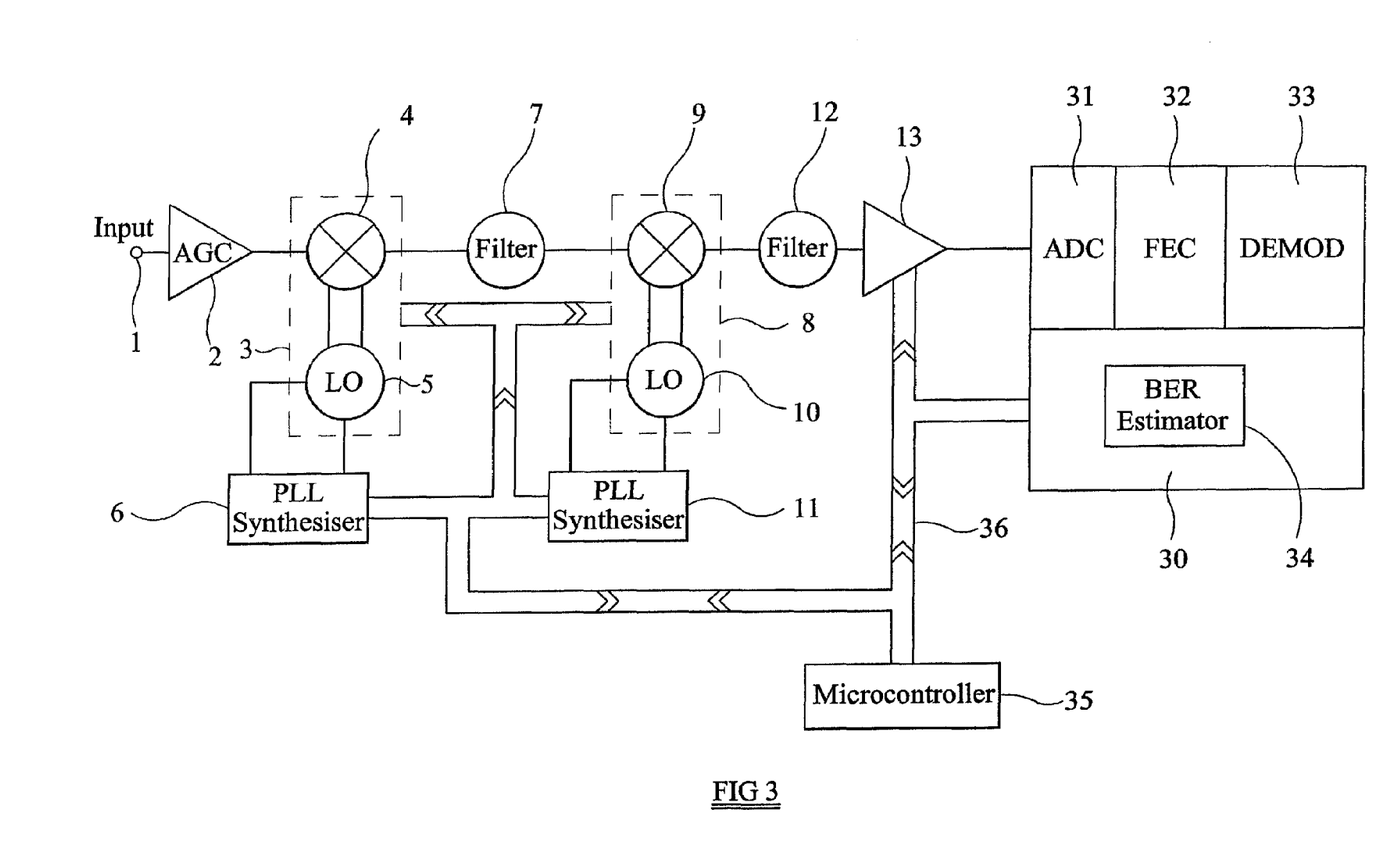
FIG. 3 is a block circuit diagram of a cable tuner constituting an embodiment of the invention.

The digital cable tuner shown in FIG. 3 is of the double-conversion type and is similar to that illustrated in FIG. 1. Accordingly, only the aspects of construction and operation which differ from those described with reference to FIG. 1 will be described in detail.

The output of the IF amplifier 13 is connected to a demodulator 30 for demodulating the selected received channel in accordance with the type of modulation which it uses. For example, the demodulator 30 may be arranged to demodulate quadrature amplitude modulated signals in order to extract the required digital data, for example for television reception.

The demodulator 30 comprises an analogue/digital converter (ADC) stage 31 which converts the incoming IF signal to a corresponding digital signal. A forward error correction (FEC) stage 32 performs error correction and the corrected signal is supplied to a demodulator stage 33 which supplies the output signal of the demodulator 30. The demodulator 30 also comprises a bit error rate (BER) estimator 34, which provides a signal representing the bit error rate. This rate may be the instantaneous rate, a time averaged value, or any appropriate indication of the bit error rate suitable for the subsequent processing as described hereinafter.

The tuner comprises a microcontroller 35 which is connected to various parts of the tuner by means of a 12C bus 36. The microcontroller 35 sends and receives data via the bus 36 and performs various control operations, for example including controlling the synthesisers 6 and 11 so as to ensure that a channel selected for reception is correctly tuned. The microcontroller 35 receives data from the demodulator 30 including the bit error rate value provided by the estimator 34. In addition to the synthesisers 6 and 11, the microcontroller 35 controls the power consumption of the frequency changers 3 and 8 and the IF amplifier 13 via the bus 36.

Figure 4:
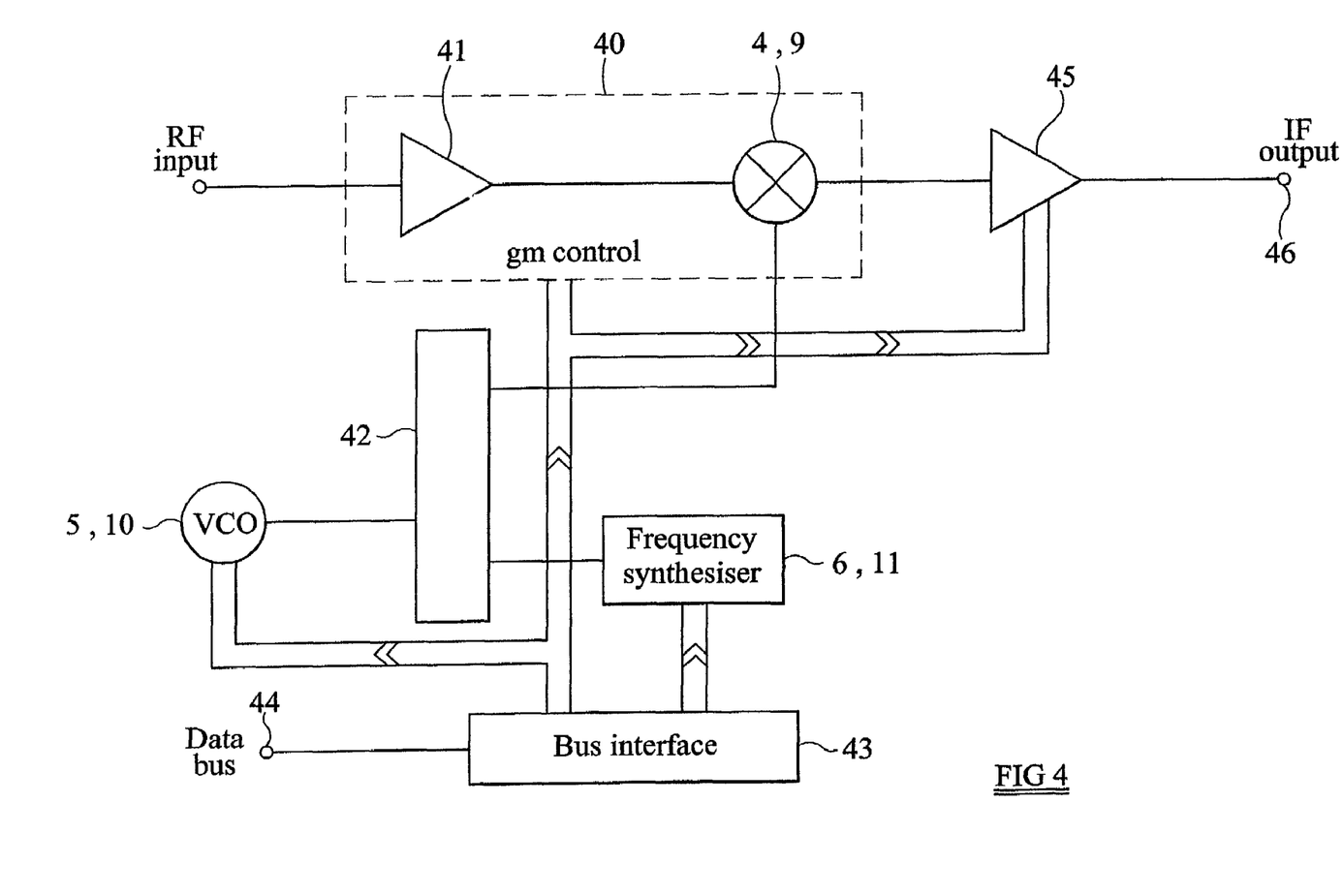
FIG. 4 is a block circuit diagram showing in more detail one of the stages of the tuner shown in FIG. 3.

The frequency changers 3 and 8 are modified as compared with the corresponding frequency changers shown in FIG. 1 as illustrated in FIG. 4. Thus, each frequency changer has a radio frequency (RF) input connected to a mixer stage 40 comprising a low noise amplifier (LNA) 41 and a mixer 4, 9. The local oscillator 5, 10 comprises a voltage controlled oscillator (VCO) whose output is connected to a signal splitter 42, which supplies the local oscillator signal to the mixer 4, 9 and to the frequency synthesiser 6, 11. The frequency changer comprises a bus interface 43 having an input 44 for connection to the bus 36 and output busses connected to the frequency synthesiser 6, 11, the mixer stage 40, the oscillator 5, 10, and an IF amplifier 45 whose input is connected to the output of the mixer 4, 9 and whose output 46 constitutes the IF output of the frequency changer.

The frequency synthesiser 6, 11 is controlled in the conventional way via the bus interface 43 so that the VCO 5, 10 is tuned to the desired frequency for converting the selected channel to the desired output intermediate frequency. The mixer stage 40 has a control input connected to the interface 43 so as to control the power consumption of this stage. Thus, the microcontroller 35 can control the power consumption of the mixer stage 40 via the bus 36, the input 44, and the bus interface 43. The power consumption of the LNA 41 or of the mixer 4, 9 or of both of these may be controlled.

The performance of the mixer stage 40 depends on its power consumption. In particular, the intermodulation performance is a direct function of the power consumption. However, the transconductance gm and hence the gain is also a direct function of the power consumption of this stage. Thus, throughout at least a part of the range of power consumptions of this stage, as the power consumption is increased, the transconductance, gain and the intermodulation performance all increase or improve monotonically.

In order to compensate for variations in gain as a result of variations in transconductance resulting from varying the power consumption of the stage 40, the LNA 41 or the mixer 4, 9 or both may have a load whose value is varied simultaneously with varying the power consumption of the stage. Such an arrangement is described in more detail hereinafter and allows changes in gain resulting from changing the power consumption of this stage to be at least partly compensated. However, although it is possible to compensate for gain variations as a result of controlling the power consumption, the signal corrupting performance such as the intermodulation performance is reduced as the power consumption of the stage is reduced.

The bus interface 43 is also connected to the IF amplifier or buffer 45 in order to control its power consumption. As the power consumption of the buffer 45 is reduced, its transconductance and hence its gain is reduced. The buffer 45 may have a programmable load impedance which is controlled so as to compensate at least partly for reduced transconductance with power consumption in order to restore at least partly the gain of this stage and make it less sensitive to changes in power consumption.

The interface 43 is also connected to the VCO 5, 10 so as to control the power consumption of the oscillator. As the power consumption is reduced, the phase noise performance of the oscillator 5 is reduced.

When the tuner shown in FIGS. 3 and 4 is initially powered and/or periodically thereafter, an adjustment routine is controlled by the microcontroller 35 in order to minimise the tuner power consumption while maintaining an acceptable minimum performance for reception of a selected desired channel. Initially, the power consumption of the tuner, particularly the frequency changers 3 and 8 and the IF amplifier 13, is set to a maximum value so that the tuner operates at its best performance level, for example in terms of signal to noise plus intermodulation performance. The microcontroller 35 controls the synthesisers 6 and 11 in accordance with a user request to select and receive a desired channel from the range of channels supplied to the tuner via the cable distribution network. The AGC stage 2, the frequency converters 3 and 8, the filers 7 and 12 and the amplifier 13 perform as described hereinbefore with reference to FIG. 1.

The demodulator 30 digitises and error-corrects the IF signal, which is then demodulated to supply the channel signal, for example to a television receiver in the case of a channel providing a television service. The estimator 34 estimates the bit error rate and supplies this to the microcontroller 35. The demodulator 30 also supplies to the microcontroller 35 data indicating the type of modulation scheme used by the selected channel. For example, in the case of quadrature amplitude modulation (QAM), the demodulator indicates to the microcontroller 35 which QAM level is employed by the selected channel.

The microcontroller 35 determines on the basis of the type of modulation scheme and, in particular, the QAM level an acceptable performance for the selected channel. In the case of QAM, a high level modulation scheme such as "QAM 256" requires a higher level of tuner performance that a lower level modulation scheme, such as "QAM 16". The microcontroller 35 derives from the acceptable performance first and second predetermined performances which are higher and lower than the acceptable performance and compares the bit error rate from the estimator 34 with the first and second predetermined performances. If the bit error rate is such that the tuner performance exceeds the first predetermined performance, the microcontroller 35 reduces the power consumption of the first frequency changer 3 by supplying the appropriate control signal as data via the bus 36, the input 44 and the bus interface 43 of the first frequency changer. In particular, the power consumption of the mixer stage 40 is reduced and this reduces the performance, particularly the signal to noise plus intermodulation performance, of the first frequency changer 4.

For as long as the bit error rate indicates a tuner performance in excess of the first predetermined performance, the power consumption of the first frequency changer 3 is incrementally reduced and this process stops when the performance falls below the first predetermined performance. If the minimum power consumption of the first frequency changer 3 is reached before the performance falls below the first predetermined performance, then the power consumption of the second frequency changer 8 is incrementally reduced until it reaches a minimum permitted power consumption or its performance falls below the first determined performance. Thus, in this example, the full power consumption range of the first frequency changer 3 is used before adjusting the power consumption of the second frequency changer. However, other control algorithms are possible and, for example, the microcontroller 35 may reduce the power consumptions of the first and second frequency changers alternately. Also, the power consumptions and hence performances of other stages, such as the oscillators 5 and 10, the buffers 45 and the amplifier 13 may be controlled using any appropriate strategy.

If the performance of the tuner as indicated by the bit error rate falls below the second predetermined performance, then the control algorithm is "reversed" and the power consumption is increased. In the previously described case where the full power consumption range of the first frequency changer 3 is used before adjusting the power consumption of the second frequency changer 8, the power consumption of the second frequency changer 8 is incremented upwardly to its maximum value and this is then repeated for the first frequency changer 3 until the performance exceeds the second predetermined performance. The gap between the first and second predetermined performances provides hysteresis to ensure stable operation of the control algorithm. Although the second predetermined performance has been indicated as being below the acceptable performance, it is also possible for the second predetermined performance to be equal to or greater than the acceptable performance but it should always be less than the first pre-determined performance.

This control algorithm may be performed on initially powering the tuner with the performance then remaining fixed until the tuner is depowered and repowered. As an alternative, the algorithm may be performed periodically, for example when a different channel is selected by a user so as to ensure that the tuner power consumption is minimised for the selected channel while ensuring that the selected channel is received with acceptable performance.

The increments in power consumption of the or each controlled stage may be chosen so as to provide a desired overall performance of the tuner. For example, fixed increments may be used, in which case the degree of power consumption minimisation depends on the increment size, as does the rate at which the power consumption converges to a steady or more steady state. Alternatively, the increment sizes may be a function of the difference between the current tuner performance and the acceptable performance. Such an arrangement provides a more rapid convergence but requires a slightly more complex control algorithm.

It is thus possible to minimise or at least reduce the power consumption of the tuner while maintaining acceptable performance for the received signals. In the case of digitally encoded signals, once an acceptable performance has been achieved, there is no need for a better tuner performance, which would require greater power consumption. The tuner may therefore be operated such that its power consumption is substantially less than would have to be provided by a known type of tuner without any perceivable degradation in the received signals.

Figure 5:
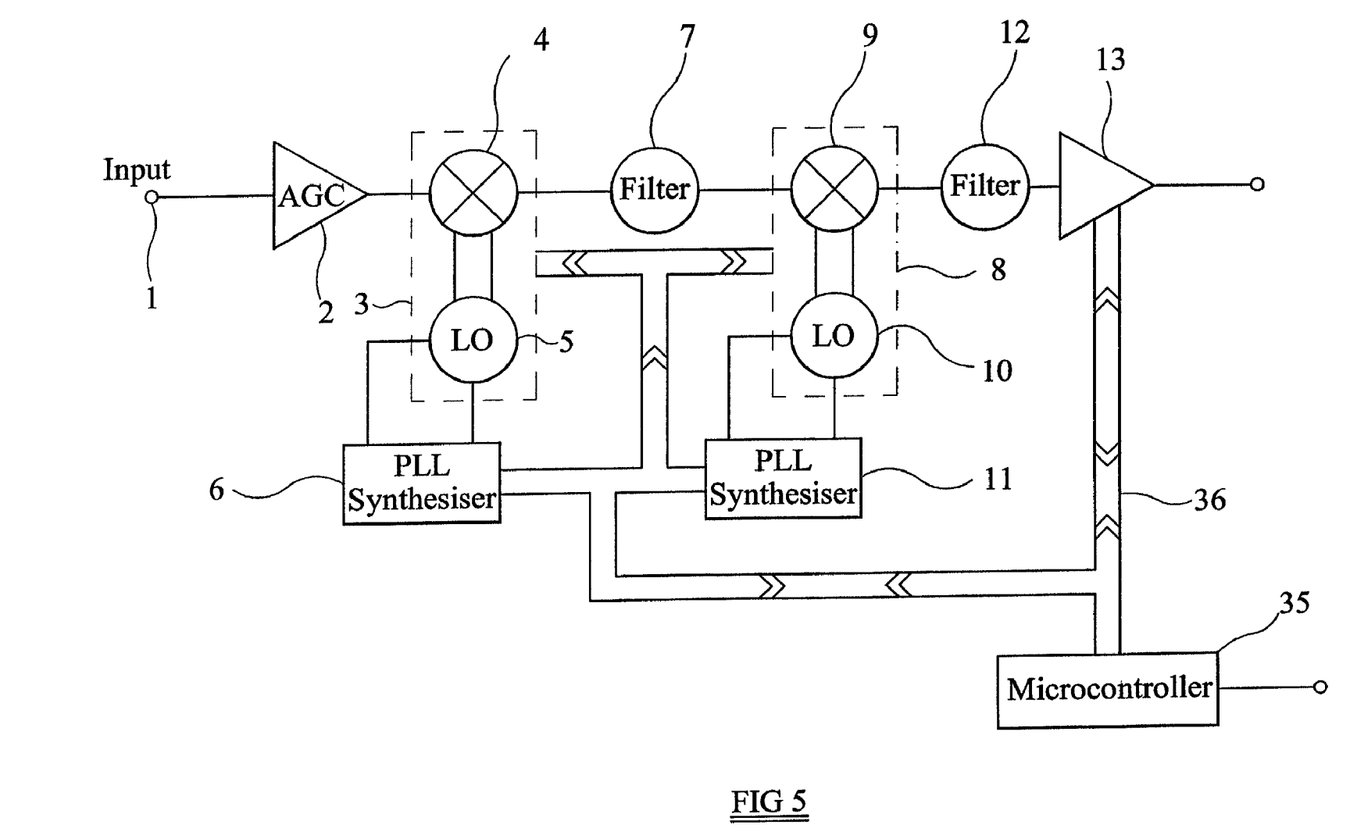
FIG. 5 is a block circuit diagram of a cable tuner constituting another embodiment of the invention.

The tuner shown in FIG. 5 differs from that shown in FIG. 3 in various ways and allows the power consumption and hence the performance of the tuner to be set independently of the actual performance being achieved by the tuner. Thus, the demodulator 30 is not necessary to the functioning of the tuner of FIG. 5 and has been omitted from the drawing. The microcontroller 35 does not perform the adjustment routine described hereinbefore but instead has an input 38 which allows the power consumption and hence performance of each of the stages whose power consumption can be controlled to be adjusted or selected independently of the other stages. At least one of these stages, or another stage, is arranged to have its gain varied to compensate at least partly for any resulting change in gain. The input 38 to the microcontroller 35 is shown by way of example only and any other control input arrangement or power consumption setting arrangement which allows the individual stage power consumptions to be selected may be used.

The power consumption of each stage may be selected continuously or may be selected from a plurality of pre-set available power consumptions. The power consumptions may be set during manufacture of the tuner so as to adapt it to a specific application or may be made available to a user to select the stage power consumptions in order to adapt a standard or "universal" tuner design to a specific application.

The frequency changers 3 and 8 of FIG. 5 are of the same type as shown in FIG. 4. Although the mixer stage 40 is shown as having a separate low noise amplifier 41 from the mixer 4, 9, the low noise amplifier and mixer may be combined as a single stage with the input transconductance of the mixer forming the low noise amplifier.

The standing or quiescent current of either or both of the low noise amplifier and the mixer 4, 9 can be adjusted by the microcontroller 35 via the bus 36, the input 44 and the interface 43 in accordance with a preset desired standing current set via the input 38. Adjusting the standing current, and hence the power consumption, of the mixer stage 40 allows the transconductance of the stage to be adjusted. As the standing current is reduced, the power consumption of the frequency changer is reduced and the noise figure is improved. The resulting improvement in the noise figure allows the frequency changer to be operated at a lower input signal level while maintaining the same signal-to-noise ratio. A consequence of this is that the intermodulation performance improves. Reducing the standing current allows the second order intermodulation performance to be substantially maintained but the third order intermodulation performance is reduced. The gain of the stage is reduced but this may be compensated if necessary, for instance by providing a programmable load at the output of the mixer stage so as to maintain the gain or by providing the facility of an externally mounted component which may be selected so as to maintain the gain.

The same mechanism is used to control the power consumption and hence the phase noise performance of the local oscillators 5 and 10 in accordance with a selection signal at the input 38. This allows the same tuner design to be used for a variety of applications and permits the power consumption of the tuner to be optimised for each application. For example, if the tuner is required to receive analogue signals, the standing currents and hence the power consumptions of the mixer stages 40 are set to high values so as to provide the necessary intermodulation and cross-modulation distortion performance. However, because phase noise performance does not have to be particularly good for analogue signals, the power consumptions of the local oscillators 5, 10 may be reduced. For reception of digital signals where the intermodulation and cross-modulation performances are less critical but a high phase noise performance is required, the power consumptions of the mixer stages 40 can be selected at a lower level and the power consumptions of the oscillators 5, 10 at a higher level in accordance with the particular digital modulation standard being used. For applications where the tuner is powered from the cable distribution network, the various stage power consumptions can be set to the minimum value consistent with obtaining adequate performance for the signals being received.

Figure 6:
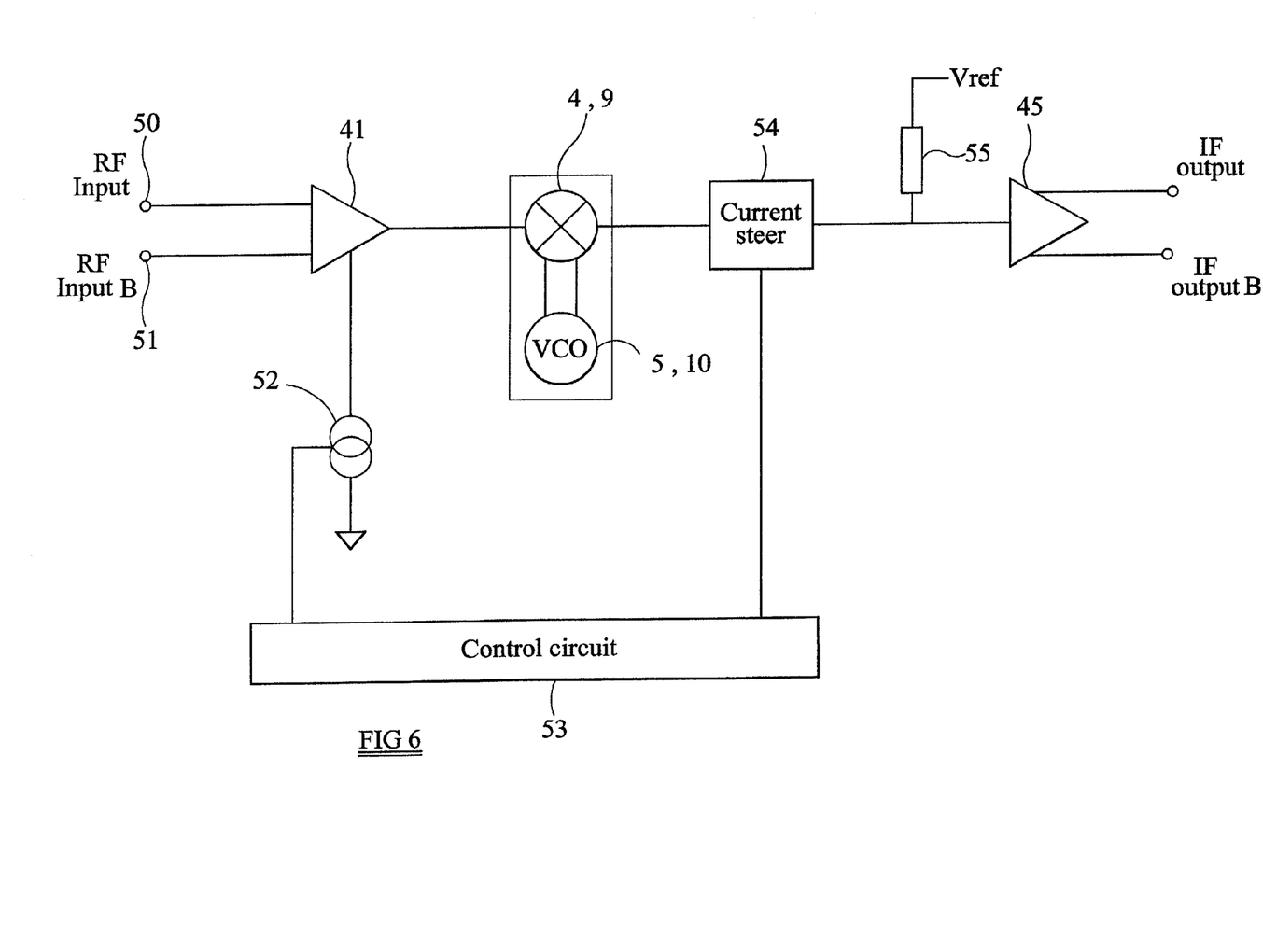
FIG. 6 is a block circuit diagram showing another frequency changer stage which may be used in the tuners of FIGS. 3 and 5.

The frequency changer stage shown in FIG. 6 comprises a differential input transconductance stage 41 having differential or balanced inputs 50, 51 and a controllable current generator 52 controlled by a control circuit 53. The output of the transconductance stage 41 is supplied to the mixer 4, 9, which performs non-linear switching of the input current by the signal from the local oscillator 5, 10.

The output of the mixer 4, 9 is supplied to a current steering stage 54 which is controlled by the control circuit 53 so as to compensate for changes in the transconductance of the stage 41 resulting from varying the power consumption thereof. The current steering stage 54 linearly steers the mixer output current into or away from a mixer load 55 so as to provide the gain compensation. The output signal is then amplified by the amplifier 45.

The transconductance stage 41 converts the input signal linearly into a current output, whose magnitude for a given input signal depends on the magnitude of the standing current set by the current generator 52 and on negative emitter feedback or "degeneration", which is usually fixed. As the standing current is varied by the control circuit 53, the mixer performance such as the intermodulation and noise performance is also varied. The transconductance varies and the resulting variation in mixer gain is compensated by adjusting the current steering circuit 54 to vary the mixer output current steered into the mixer load 55 so as to compensate for changes in the transconductance of the stage 41 resulting from changing its power consumption.

Figure 7:
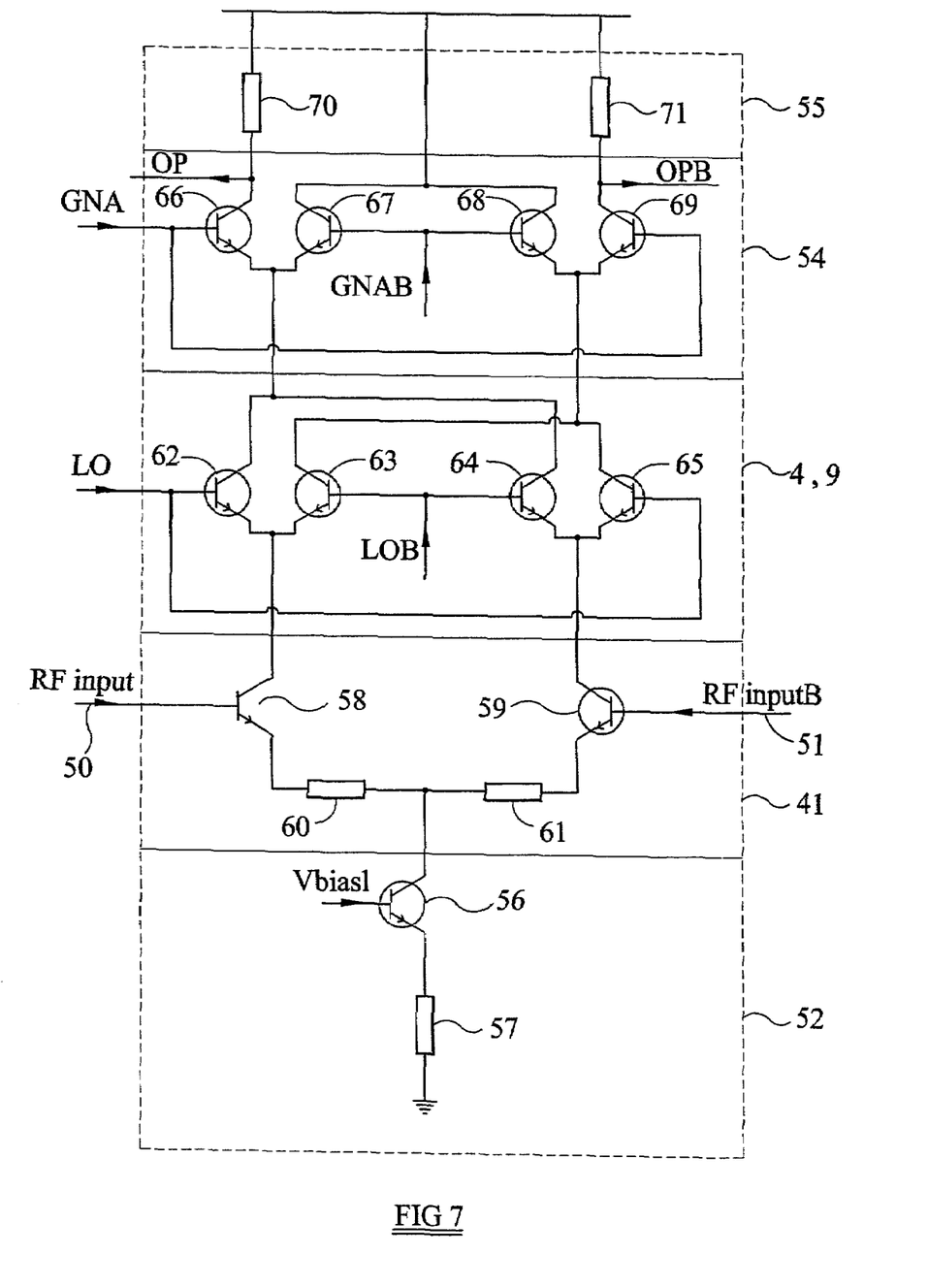
FIG. 7 is a circuit diagram of the mixer arrangement shown in FIG. 6.

FIG. 7 illustrates the mixer arrangement of FIG. 6 in more detail. The current generator 52 comprises a transistor 56 whose emitter is connected to a ground line via an impedance 57 and whose base receives a current-setting bias signal Vbias1 from the control circuit 53. The collector of the transistor 56 supplies the standing current to the transconductance stage 41, which comprises differentially connected transistors 58 and 59 provided with emitter feedback or degeneration impedances 60 and 61. The impedances 57, 60 and 61 may be resistive or reactive or any combination thereof so as to define a desired pass/stop band characteristic.

The mixer 4, 9 is a cross-coupled Gilbert arrangement comprising transistors 62 to 65. The mixer receives the output currents from the collectors of the transistors 58 and 59 together with switching signals LO and LOB from the local oscillator 5, 10 and supplies differential output signals to the current steering stage 54.

The stage 54 comprises transistors 66 to 69 arranged as two coupled emitter pairs. The balanced currents from the mixer 4, 9 are supplied to the emitters of the differential pair 66 and 67 and to the emitters of the differential pair 68 and 69. The bases of the transistors 66 to 69 receive balanced gain control signals GNA and GNAB from the control circuit 53 so as to control the amount of mixer output current steered into the load 55. The load 55 comprises impedances 70 and 71 which may also be resistive or reactive or a combination to provide a desired pass/stop band characteristic. The mixer stage outputs OP and OPB are supplied to the amplifier 45.

Figure 8:
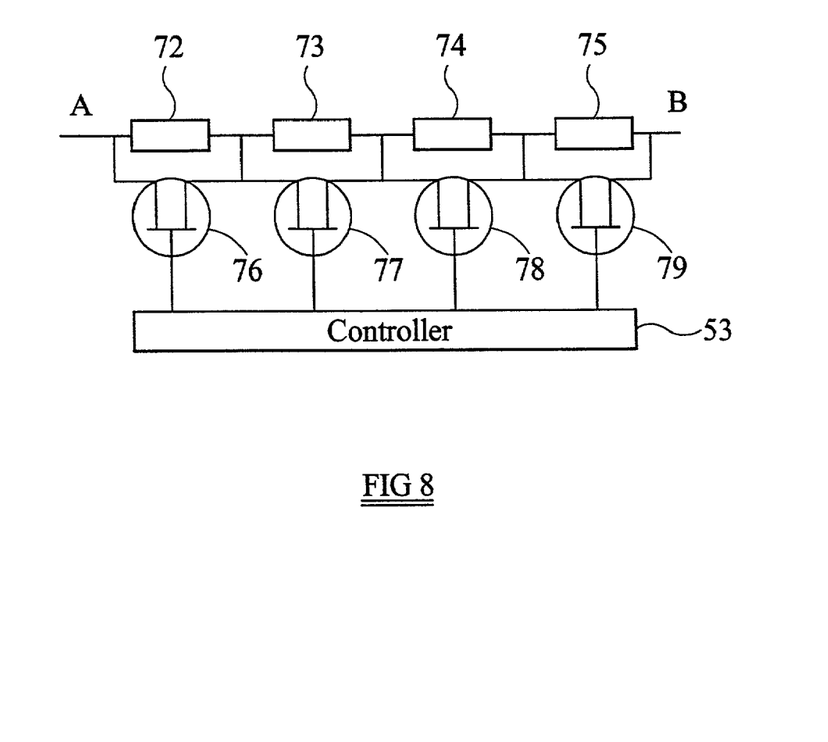
FIGS. 8 to 10 are circuit diagrams of switchable impedances which may be used to provide gain compensation or to control current consumption in one or more of the stages of the tuners shown in FIGS. 3 and 5.

The degeneration impedances 60 and 61 shown in FIG. 7 as being fixed impedances may be made variable and may, for example, be arranged to track the variable current supplied by the current generator 52 so as to maintain a given intermodulation performance. For example, as shown in FIG. 8, individual impedances 72 to 75 are switchable in or out of a series circuit by field effect transistors 76 to 79 controlled by the controller 53 so that any series combination of the impedances may be provided between nodes A and B. Such an arrangement may be used in place of each of the fixed impedances 60 and 61 shown in FIG. 7.

Figure 9:
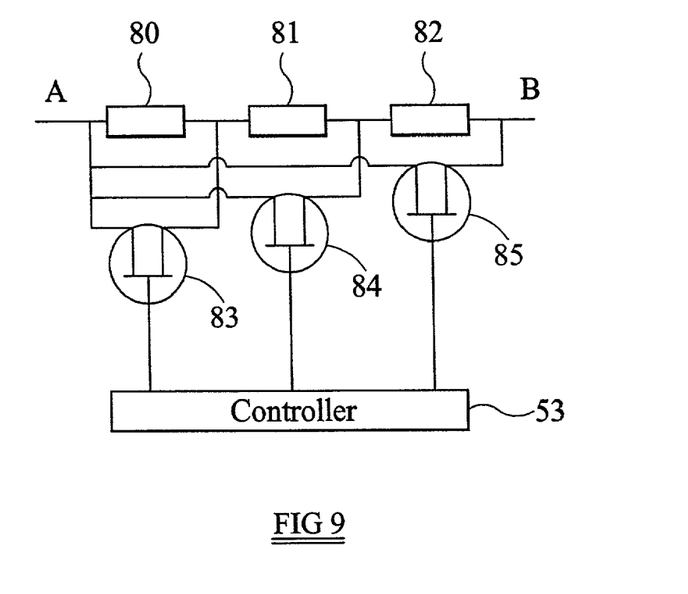

FIG. 9 shows an alternative switched impedance arrangement comprising individual impedances 80 to 82 which are switchable into the circuit between the nodes A and B by field effect transistors 83 to 85. The arrangement of FIG. 9 is less flexible in value than the arrangement of FIG. 8 but also exhibits lower parasitic elements associated with the switching.

Figure 10:
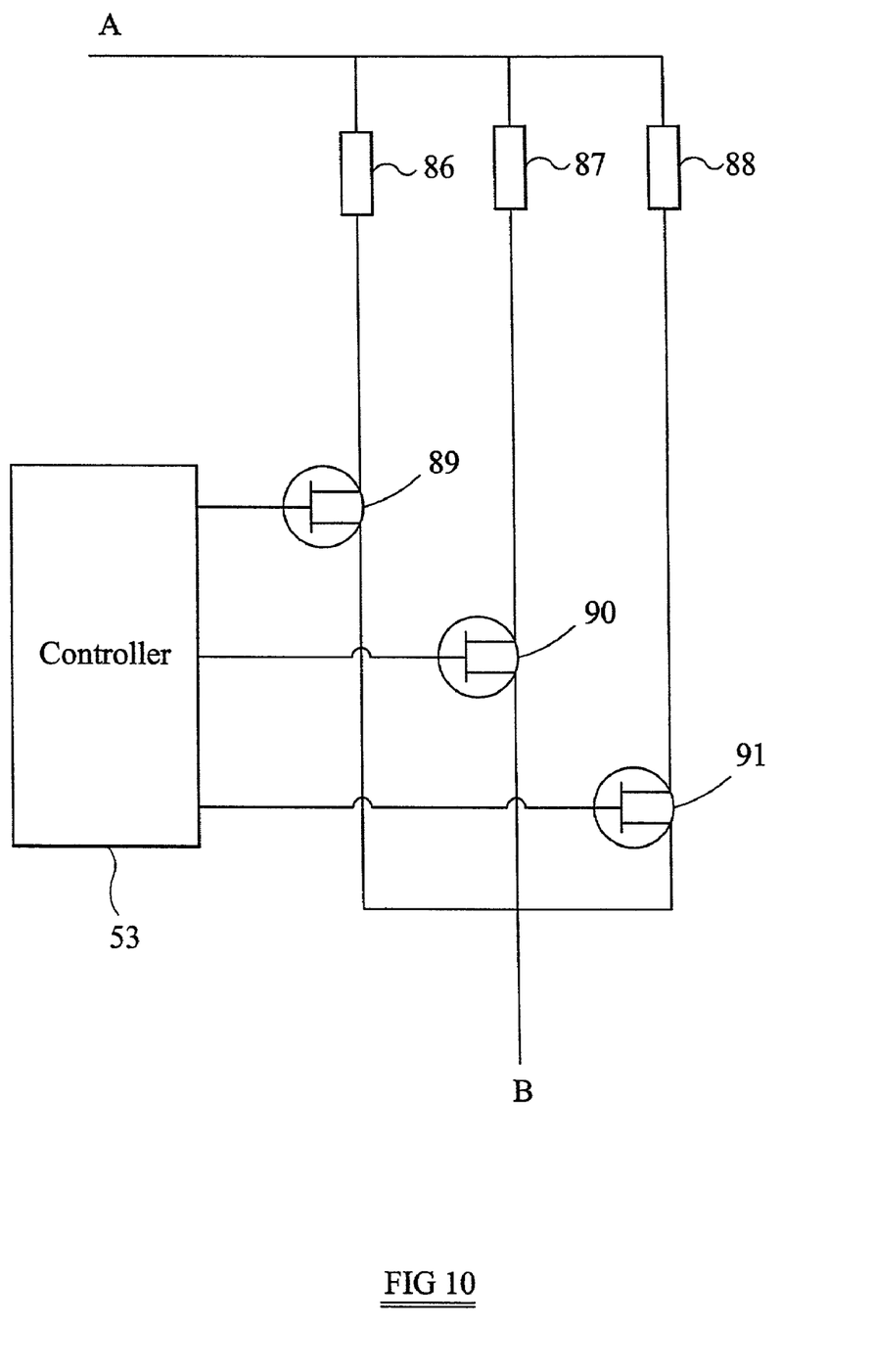

FIG. 10 illustrates a further arrangement in which individual impedances 86 to 88 are switchable in any parallel combination by field effect transistors 89 to 91 between the nodes A and B.

It is also possible for the current steering stage 54 and the fixed mixer load 55 to be replaced by a variable load impedance controlled by the controller 53. For example, the stage 54 may be omitted and the current outputs from the stage 4, 9 may be supplied to respective switched load arrangements, each of which may be of any of the types illustrated in FIGS. 8 to 10. Alternatively, each load may comprise a field effect transistor controlled by the controller 53 to present a varying load to the mixer 4, 9.

Figure 11:
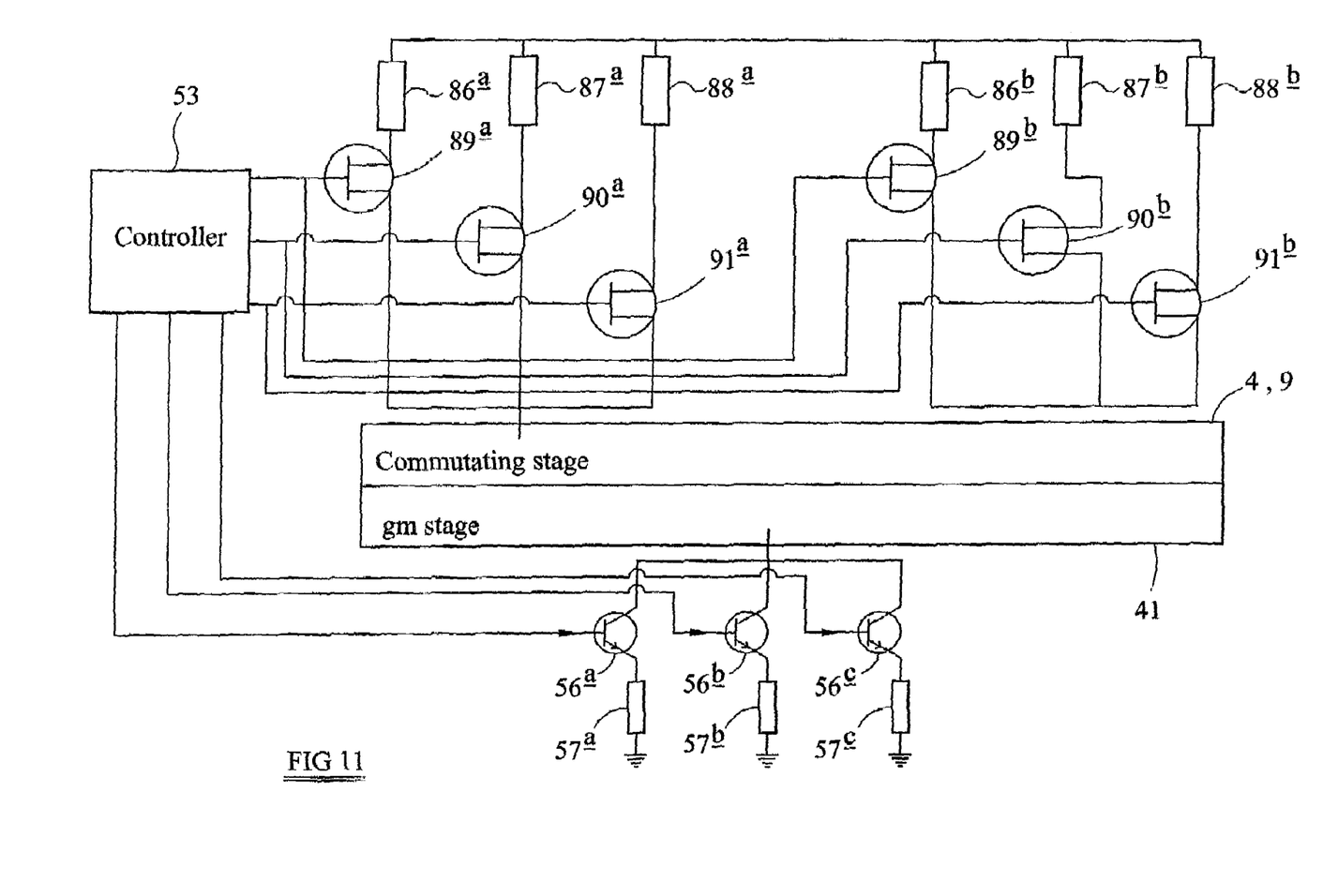
FIG. 11 is a circuit diagram of a mixer arrangement illustrating another arrangement for controlling the power consumption and compensating for gain variations.

FIG. 11 illustrates an arrangement in which the current generator 52 comprises three switchable individual current generators 56a, 57a; 56b, 57b; 56c, 57c individually actuable by the controller 53. The mixer or commutating stage 4, 9 is provided with switchable loads of the type illustrated in FIG. 10 with one load comprising the components 86a to 91a and the other load comprising the components 86b to 91b. The individual current generators are switched in sympathy with the switched load so as to vary the current consumption and compensate for changes in transconductance to provide a substantially constant gain for the frequency changer.

It is also possible to provide switched impedances 57 in the emitter circuit of the current generator 52 so as to provide a switched current source and, for example, any of the switched impedance arrangements illustrated in FIGS. 8 to 10 may be used. Also, switched emitter degeneration in the transconductance stage 41 may also be provided in the arrangement shown in FIG. 11 with the switching of the emitter degeneration being in sympathy with switching of the current sources and loads.

Figure 12:
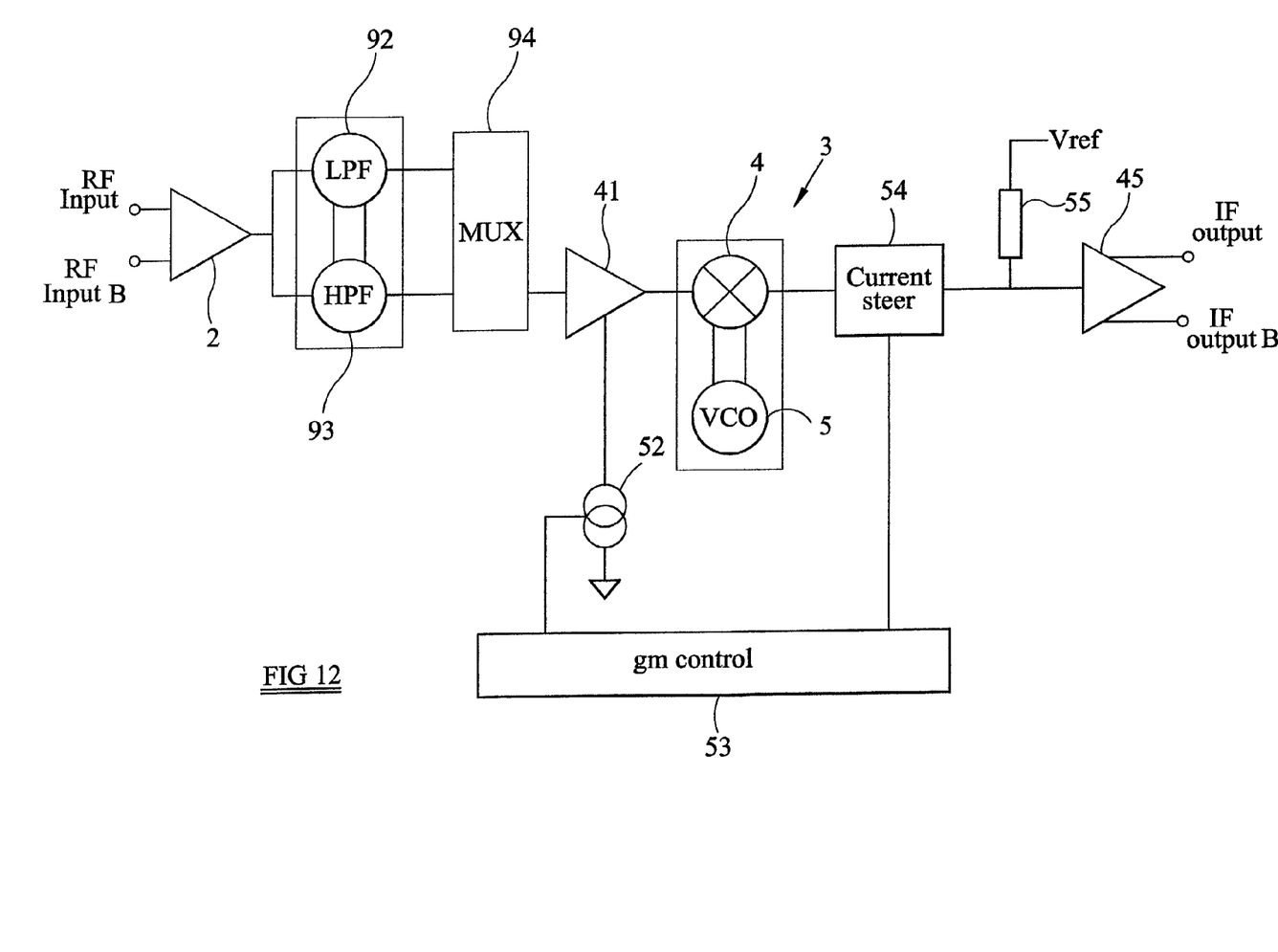
FIG. 12 is a circuit diagram of a further frequency changer stage for use in the tuners of FIGS. 3 and 5 illustrating an input arrangement.

FIG. 12 illustrates another arrangement in which the frequency changer 3 is connected to the AGC circuit 2 by a bandsplitting arrangement. In particular, the output of the circuit 2 is connected to the inputs of a plurality of filters (in this case two filters comprising a low pass filter (LPF) 92 and a high pass filter (HPF) 93), which divide the input frequency spectrum into a plurality (in this case two) of frequency sub-bands where adjacent bands are contiguous or overlap with each other. The outputs of the filters 92 and 93 are supplied to a multiplexer (MUX) 94 whose output is connected to the input of the transconductance stage 41 of the frequency changer 3.

The multiplexer 94 is controlled by the synthesiser 6 so as to connect the input of the transconductance stage 41 to the output of the one of the filters 92, 93 whose passband contains the channel which has been selected for reception. The signal energy supplied to the frequency changer 3 is thus substantially reduced so that the required intermodulation performance is also reduced. This allows the frequency changer 3 to operate with reduced power consumption while achieving the necessary intermodulation performance.

Figure 13:
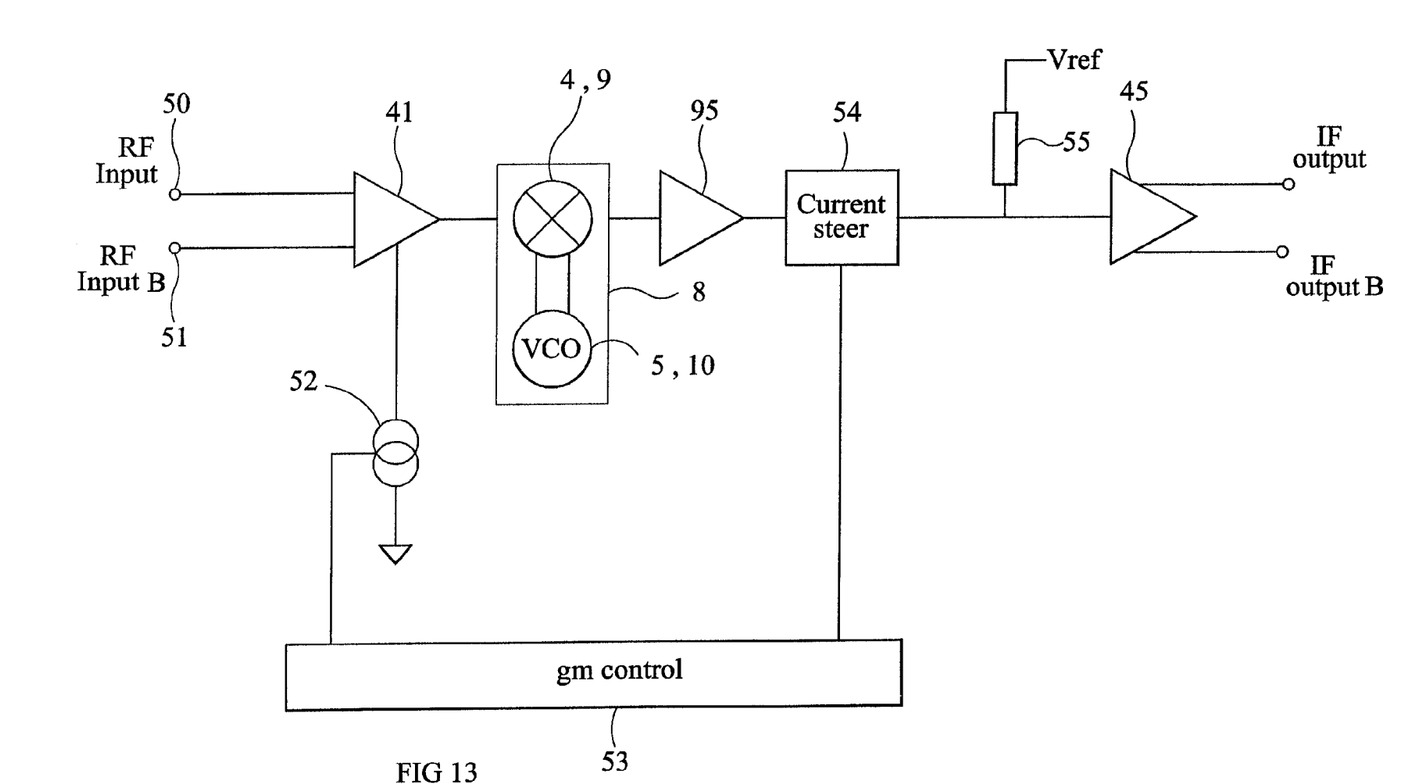
FIG. 13 is a circuit diagram of another frequency changer stage which may be used in the tuners of FIGS. 3 and 5.

The arrangement shown in FIG. 13 differs from that shown in FIG. 6 in that a buffer 95 is provided between the mixer 4, 9 and the current steering stage 54. The buffer may be of unity gain or may have a fixed or variable gain. The buffer 95 may also provide voltage level shifting to facilitate internal biasing of the frequency changer.

What is claimed is:

1. A radio frequency tuner comprising:
an Inter-Integrated circuit (I2C-bus);
a frequency changer including:
a mixer stage to receive a radio frequency (RE) input and having a performance and a gain which are first and second functions of a power consumption; and
a bus interface, coupled to the I2C bus, having an input coupled to a data bus;
a microcontroller, coupled to the I2C bus, to control a variable gain arrangement of the mixer stage via the bus interface to compensate at least partly for a variation of said gain of at least one stage; and
a comparator for comparing a tuner performance with a first predetermined performance and for causing said microcontroller to reduce said power consumption of said at least one stage when said tuner performance exceeds said first predetermined performance.

2. A tuner as claimed in claim 1, in which said comparator is arranged to compare said tuner performance with a second predetermined performance lower than said first predetermined performance and said microcontroller is arranged to increase the power consumption of said at least one stage when said tuner performance is less than said second predetermined performance.

3. A tuner as claimed in claim 2, in which said second predetermined performance is less than or equal to an acceptable minimum performance.

4. A tuner as claimed in claim 1, in which said tuner performance is a ratio of signal to noise plus intermodulation products.

5. A tuner as claimed in claim 1, comprising a digital tuner.

6. A tuner as claimed in claim 5, in which said tuner comprises a demodulator and said tuner performance is a bit error rate.

7. A tuner is claimed in claim 6, in which said bit error rate is an instantaneous bit error rate.

8. A tuner as claimed in claim 6, in which said bit error rate is a time-averaged bit error rate.

9. A tuner as claimed in claim 6, in which said bit error rate is a combination of an instantaneous bit error rate and a time-averaged bit error rate.

10. A tuner as claimed in claim 1, in which said first predetermined performance is greater than or equal to an acceptable minimum performance.

11. A tuner as claimed in claim 1, in which said comparator is arranged to perform a comparison continuously.

12. A tuner as claimed in claim 1, in which said comparator is arranged to perform a comparison periodically.

13. A tuner as claimed in claim 1, in which said comparator is arranged to perform a comparison each time said tuner is powered up.

14. A tuner as claimed in claim 1, in which said comparator is arranged to perform a comparison each time a change of a tuned frequency is requested.

* * * * *